United States Patent
Sorenson et al.

(10) Patent No.: US 11,300,535 B2
(45) Date of Patent: Apr. 12, 2022

(54) INTEGRATED SENSOR APPARATUS WITH PRESSURE SENSING ELEMENT AND FLOW SENSING ELEMENT

(71) Applicant: Honeywell International Inc., Morris Plains, NJ (US)

(72) Inventors: Richard Charles Sorenson, London, OH (US); Steven Lowery, Grove City, OH (US); Ian Bentley, New Ipswich, NH (US)

(73) Assignee: HONEYWELL INTERNATIONAL INC., Morris Plains, NJ (US)

(*) Notice: Subject to any disclaimer, the term of this patent is extended or adjusted under 35 U.S.C. 154(b) by 292 days.

(21) Appl. No.: 16/376,678

(22) Filed: Apr. 5, 2019

(65) Prior Publication Data

US 2020/0319127 A1  Oct. 8, 2020

(51) Int. Cl.
| | |
|---|---|
| *G01N 27/12* | (2006.01) |
| *G01F 1/69* | (2006.01) |
| *G01K 7/16* | (2006.01) |
| *G01L 9/00* | (2006.01) |
| *H05B 3/00* | (2006.01) |

(52) U.S. Cl.
CPC ............. *G01N 27/128* (2013.01); *G01F 1/69* (2013.01); *G01K 7/16* (2013.01); *G01L 9/0098* (2013.01); *G01N 27/123* (2013.01); *H05B 3/0019* (2013.01); *B81B 2201/0264* (2013.01); *B81B 2201/0292* (2013.01)

(58) Field of Classification Search
CPC ....... G01N 27/128; G01N 27/123; G01F 1/69; G01F 1/6842; G01F 1/34; G01F 1/6845; G01K 7/16; G01L 9/0098; G01L 19/0092; H05B 3/0019; B81B 2201/0264; B81B 2201/0292; G01D 21/02
See application file for complete search history.

(56) References Cited

U.S. PATENT DOCUMENTS

| | | | |
|---|---|---|---|
| 2011/0146398 A1* | 6/2011 | Beck ..................... | G01F 1/6845 73/204.27 |
| 2012/0318058 A1* | 12/2012 | Kimura ................. | G01F 1/6845 73/204.23 |
| 2013/0008263 A1* | 1/2013 | Kabasawa ................. | G01F 1/42 73/861.42 |
| 2015/0211946 A1 | 7/2015 | Pons et al. | |

FOREIGN PATENT DOCUMENTS

| | | |
|---|---|---|
| CN | 104359747 | 2/2015 |
| EP | 3543659 A1 | 9/2019 |

OTHER PUBLICATIONS

Extended European Search Report for Patent Application No. 20167851.3 dated Aug. 11, 2020, 9 pages.

* cited by examiner

*Primary Examiner* — David Z Huang
(74) *Attorney, Agent, or Firm* — Alston & Bird LLP

(57) ABSTRACT

An apparatus for calculating a thermal conductivity of a gaseous substance is provided. The apparatus includes a substrate; a cover member disposed on the substrate, wherein the cover member comprises a flow tunnel for the gaseous substance; a flow sensing element disposed on the substrate, wherein the flow sensing element is exposed to the gaseous substance in the flow tunnel; and a pressure sensing element disposed on the substrate, wherein the pressure sensing element is exposed to the gaseous substance in the flow tunnel.

18 Claims, 5 Drawing Sheets

INTEGRATED SENSOR APPARATUS WITH PRESSURE SENSING ELEMENT AND FLOW SENSING ELEMENT

FIELD OF THE INVENTION

The present disclosure relates generally to apparatuses, systems, and methods for an integrated sensor device. More particularly, the present disclosure describes apparatuses, systems, and methods in relation to an integrated sensor device with a flow sensing element (such as a micro-electro-mechanical system (MEMS) flow sensing die) and a pressure sensing element (such as a MEMS pressure sensing die) for calculating, for example but not limited to, a thermal conductivity of a substance.

BACKGROUND

Measurements of thermal conductivity are necessary for a variety of sensor-based apparatuses and methods. Generally, the term "thermal conductivity" refers to a measure of the ability of a substance (for example, a gaseous substance such as air) to transfer energy (in the form of heat). Typically, a substance having a low thermal conductivity transfers heat at a lower rate than a substance having a high thermal conductivity.

Applicant has identified many deficiencies and problems associated with existing methods, apparatus, and systems related to determining thermal conductivity. For example, many devices do not provide the capability to measure thermal conductivity of gaseous substance. Accordingly, there is need in the art for improved systems and methods for determining the thermal conductivity of a gaseous substance.

BRIEF SUMMARY

Various embodiments described herein relate to methods, apparatuses, and systems for providing an integrated sensor apparatus. In particular, various embodiments are related to an integrated sensor apparatus with one or more pressure sensing elements and one or more flow sensing elements disposed on the flow path for calculating, such as but not limited to, the thermal conductivity of a gaseous substance.

In accordance with various embodiments, an apparatus is provided. The apparatus comprises a substrate, a cover member comprising a flow tunnel, a flow sensing element disposed on the substrate, and a pressure sensing element disposed on the substrate. In some embodiments, the cover member is disposed on the substrate and configured to enable a gaseous substance to flow through the flow tunnel. In some embodiments, the flow sensing element is exposed to the gaseous substance in the flow tunnel and configured for sensing a flow rate of the gaseous substance through the flow tunnel. In some embodiments, the pressure sensing element is exposed to the gaseous substance in the flow tunnel and configured for sensing a pressure of gaseous substance in the flow tunnel.

In some embodiments, the cover member comprises a first port having a first opening and a second port having a second opening. In some embodiments, the first opening and the second opening are connected to one another by the flow tunnel.

In some embodiments, the apparatus further comprises an intermediate layer disposed between the substrate and the cover member, and the intermediate layer comprises a tunnel cavity.

In some embodiments, the flow sensing element comprises a heater resistor, a first temperature-sensing resistor and a second temperature-sensing resistor. In some embodiments, the heater resistor, the first temperature-sensing resistor and the second temperature-sensing resistor are disposed on the substrate.

In some embodiments, the heater resistor is disposed between the first temperature-sensing resistor and the second temperature-sensing resistor on the substrate.

In some embodiments, the flow sensing element is a micro-electro-mechanical system (MEMS) flow sensing die. In some embodiments, the pressure sensing element is a micro-electro-mechanical system (MEMS) pressure sensing die.

In some embodiments, the apparatus further comprises a processing circuitry disposed on the substrate, and the processing circuitry is electronically coupled to the flow sensing element and the pressure sensing element.

In some embodiments, the flow sensing element is configured to transmit a first signal indicative of a heat transfer rate of the gaseous substance to the processing circuitry, and the pressure sensing element is configured to transmit a second signal indicative of a pressure of the gaseous substance to the processing circuitry.

In some embodiments, the apparatus further comprises a memory circuitry storing a processing function. In some embodiments, the memory circuitry and the processing function are configured to, with the processing circuitry, cause the apparatus to calculate a thermal conductivity of the gaseous substance based on the first signal and the second signal.

In accordance with various embodiments, a system for calculating a thermal conductivity of a gaseous substance is provided. The system comprises a flow sensing element disposed on a substrate, wherein the flow sensing element is exposed to the gaseous substance; a pressure sensing element disposed on the substrate, wherein the pressure sensing element is exposed to the gaseous substance; and a processing circuitry disposed on the substrate, wherein the processing circuitry is electronically coupled to the flow sensing element and the pressure sensing element.

The foregoing illustrative summary, as well as other exemplary objectives and/or advantages of the disclosure, and the manner in which the same are accomplished, are further explained in the following detailed description and its accompanying drawings.

BRIEF DESCRIPTION OF THE DRAWINGS

The description of the illustrative embodiments may be read in conjunction with the accompanying figures. It will be appreciated that, for simplicity and clarity of illustration, elements illustrated in the figures have not necessarily been drawn to scale, unless described otherwise. For example, the dimensions of some of the elements may be exaggerated relative to other elements, unless described otherwise. Embodiments incorporating teachings of the present disclosure are shown and described with respect to the figures presented herein, in which.

DETAILED DESCRIPTION OF THE INVENTION

Figure 1:
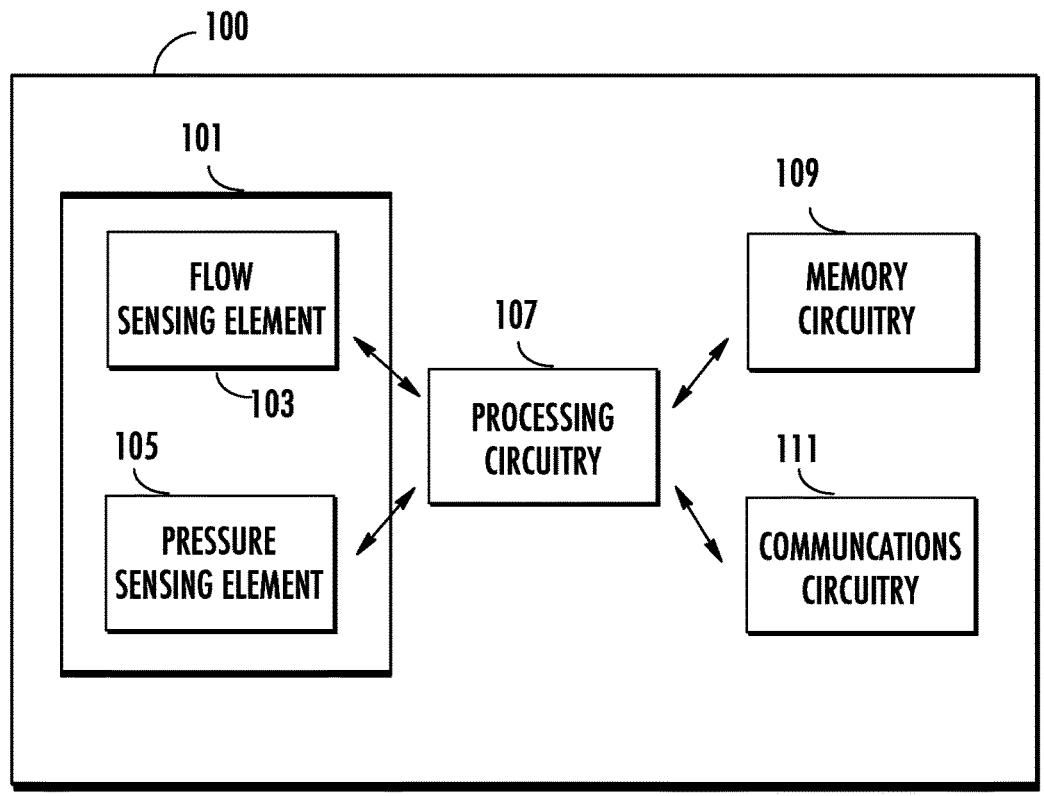
FIG. 1 illustrates a block diagram of an example system in accordance with various embodiments of the present disclosure.

Some embodiments of the present disclosure will now be described more fully hereinafter with reference to the accompanying drawings, in which some, but not all embodiments of the disclosure are shown. Indeed, these disclosures may be embodied in many different forms and should not be construed as limited to the embodiments set forth herein; rather, these embodiments are provided so that this disclosure will satisfy applicable legal requirements. Like numbers refer to like elements throughout.

The phrases "in one embodiment," "according to one embodiment," and the like generally mean that the particular feature, structure, or characteristic following the phrase may be included in at least one embodiment of the present disclosure, and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that specific component or feature is not required to be included or to have the characteristic. Such component or feature may be optionally included in some embodiments, or it may be excluded.

As described above, "thermal conductivity" indicates the ability of a substance to transfer heat. The transfer of heat may be in the form of a "thermal conduction," which may be defined as energy transfer due to microscopic particle collisions and/or electron movements across a temperature gradient. The energy that is transferred by a substance due to thermal conduction may also be referred to as the "heat conduction" of the substance for the purpose of calculating a thermal conductivity. The heat conduction may be quantified by the following vector:

$$q(r,t)$$

where r indicates the position associated with the heat conduction, and t indicates the time associated with the heat conduction. Because heat flows from a high temperature location to a low temperature location, the law of heat conduction (also known as Fourier's Law) provides that the heat transfer rate through a substance is proportional to the negative temperature gradient. The Fourier's Law may be provided in the following tensorial form:

$$q(r,t) = -\kappa \cdot \nabla T(r,t)$$

where q(r,t) is the heat conduction, and ∇T(r,t) is the temperature gradient tensor. κ is the second-tensor of thermal conductivity (also known as the "thermal conductivity tensor"), which may correlate to the thermal conductivity of the substance. Based on the above tensorial form of Fourier's Law, the thermal conductivity tensor may be calculated based on:

$$\kappa = -\frac{q(r,t)}{\nabla T(r,t)}$$

As shown in the equation above, the thermal conductivity tensor K may be affected by the temperature gradient tensor ∇T(r,t). In other words, the thermal conductivity of a gaseous substance may be affected by its temperature. The General Gas Equation (also known as the Ideal Gas Law) provides that the temperature of the gaseous substance may be affected by its pressure:

$$PV = nRT = Nk_B T$$

where P is the pressure of the gaseous substance, T is the temperature of the gaseous substance, V is the volume of the gaseous substance, n is the amount of the gaseous substance, N is the number of gas molecules, R is the gas constant, and $k_B$ is the Boltzmann constant.

In various embodiments of the present disclosure, example methods, apparatuses, and systems may provide an integrated sensor apparatus for calculating, for example but not limited to, a thermal conductivity of a gaseous substance (such as air) based on, for example but not limited to, the Fourier's Law and the General Gas Equation described above. Referring now to FIGS. 1-6, example apparatuses and systems are illustrated.

FIG. 1 illustrates an example system 100 within which embodiments of the present disclosure may operate. The system 100 may include an integrated sensor device 101, processing circuitry 107, memory circuitry 109, and communications circuitry 111. The integrated sensor device 101, the processing circuitry 107, the memory circuitry 109, and the communications circuitry 111 may be electronically coupled so that they may transmit and/or exchange information and data via wired or wireless connections between and among themselves.

The integrated sensor device 101 may include a flow sensing element 103 and a pressure sensing element 105. As used herein, the term "sensing element" refers to an apparatus that measures or detects a property associated with the location or environment surrounding the sensing element, and may further indicate, record, and/or output the record of the property.

For example, the flow sensing element 103 is an apparatus for detecting and/or measuring the air flow rate that may be caused by, for example, the heat transfer.

In some embodiments, the flow sensing element 103 may be a micro-electro-mechanical system (MEMS) flow sensing die. The MEMS flow sensing die may include miniaturized mechanical and electro-mechanical components for detecting and/or measuring air flow, and these components may be fabricated (such as through a microfabrication process) to form a functional circuit on a block of semiconducting material (such as a die).

In some embodiments, the flow sensing element 103 may comprise a heater resistor and two temperature-sensing resistors that are disposed on a substrate. In some embodiments, the heater resistor may maintain a constant temperature (for example but not limited to, 150° C.). The heater resistor may be disposed between two temperature-sensing resistors.

In some embodiments, the flow sensing element 103 may be positioned on a flow path of a gaseous substance. For example, the two temperature-sensing resistors may be configured such that one of the resistors is located upstream and the other resistor is located downstream. In such embodiments, the gaseous substance moves from the upstream temperature-sensing resistor to the downstream temperature-sensing resistor, passing the heater resistor. The gaseous substance may reduce the temperature detected by the upstream temperature-sensing resistor, and increase the temperature detected by the downstream temperature-sensing resistor. As such, the flow sensing element 103 may detect the air flow and/or calculate the air flow rate based on a heat transfer rate associated with the temperature-sensing resistors.

Further, as described above, the pressure of a gaseous substance may affect its temperature, which may further affect its thermal conductivity. In this regard, the integrated sensor device 101 may also include a pressure sensing element 105 that is disposed on the flow path of the gaseous substance.

The pressure sensing element 105 is an apparatus for detecting and/or measuring the pressure (such as the absolute pressure) of a gaseous substance. The pressure sensing element 105 may act as a transducer, which generates a signal as a function of the pressure detected or measured. In some embodiments, the pressure sensing element 105 may be a micro-electro-mechanical system (MEMS) pressure sensing die. The MEMS pressure sensing die may include miniaturized mechanical and electro-mechanical components for detecting and/or measuring pressure, and these components may be fabricated (such as through a microfabrication process) to form a functional circuit on a block of semiconducting material (such as a die).

Referring back to FIG. 1, the flow sensing element 103 and the pressure sensing element 105 may each be electronically coupled to the processing circuitry 107, and may provide one or more inputs to the processing circuitry 107. For example, the flow sensing element 103 may be configured to transmit a first signal indicative of an air flow rate and/or a heat transfer rate as detected by the flow sensing element 103. The pressure sensing element 105 may be configured to transmit a signal indicative of a pressure as detected by the pressure sensing element 105.

As used herein, the term "processing circuitry" refers to a circuitry or circuitries that may be configured to perform processing functions and/or software instructions on one or more input signals to generate one or more output signals. In various embodiments of the present disclosure, the processing circuitry 107 may perform processing functions and/or software instructions on signals that are received from the flow sensing element 103 and the pressure sensing element 105 to calculate the thermal conductivity of the gaseous substance based on, for example but not limited to, the Fourier's Law and the General Gas Equation described above.

In some embodiments, the processing circuitry 107 may implement an application-specific integrated circuit (ASIC). In these examples, the ASIC is an integrated circuit that may be customized for processing signals. In some examples, the ASIC may be fully customized or semi-customized for the particular application of processing signals. In some examples, the ASIC may be a programmable ASIC that allows circuit reconfiguration. In some embodiments, other suitable forms of the processing circuitry 107 may be implemented.

Referring back to FIG. 1, the processing circuitry 107 may be electronically coupled to the memory circuitry 109 and/or the communications circuitry 111.

The memory circuitry 109 may be non-transitory and may include, for example, one or more volatile and/or non-volatile memories. The memory circuitry 109 may be configured to store information and data (such as processing functions and/or software instructions). The memory circuitry 109, together with the processing circuitry 107, may cause the system 100 to perform various processing functions and/or software instructions in accordance with example embodiments of the present disclosure, including, for example, calculating the thermal conductivity of the gaseous substance.

The communications circuitry 111 may comprise, for example, a device or circuitry embodied in either hardware or a combination of hardware and software that is configured to receive and/or transmit data from/to a network and/or any other device, circuitry, or module in communication with the system 100 and/or the integrated sensor device 101. In this regard, the communications circuitry 111 may include, for example, a network interface for enabling communications with a wired or wireless communication network.

In FIG. 1, although components 101, 103, 105, 107, 109, and 111 may be described with respect to functional limitations, it is contemplated that the particular implementations necessarily include the use of particular hardware. It is also contemplated that certain of these components 101, 103, 105, 107, 109, and 111 may additionally include one or more similar or common hardware. For example, the integrated sensor device 101 may additionally include a processing circuitry, such that the integrated sensor device 101 may process the signals generated by the flow sensing element 103 and the pressure sensing element 105 to calculate the thermal conductivity.

Figure 2:
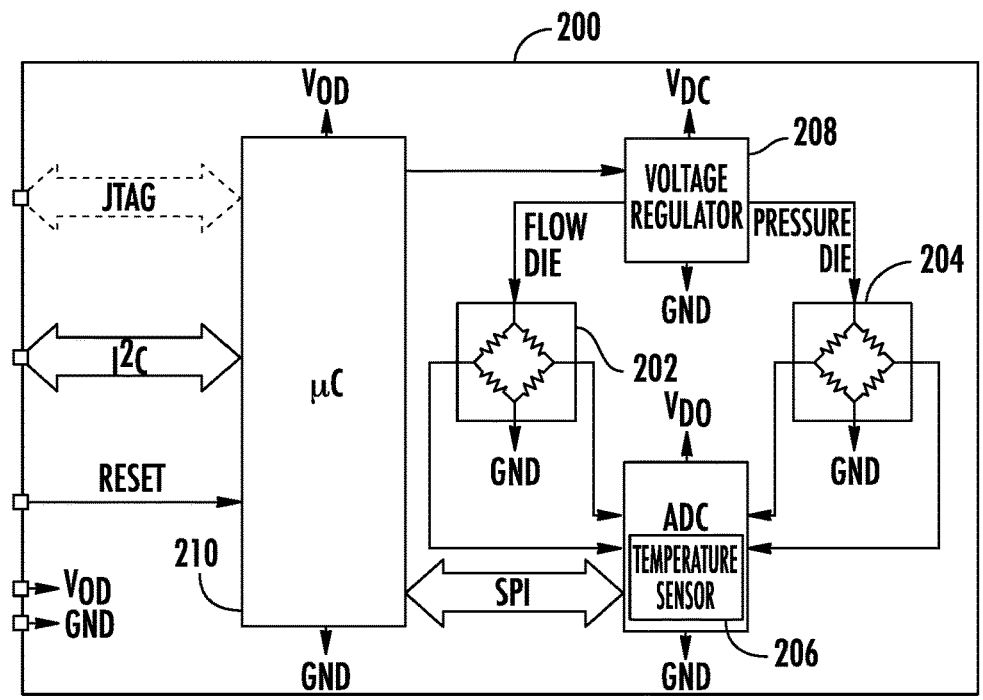
FIG. 2 illustrates a circuit diagram of an example apparatus in accordance with various embodiments of the present disclosure.

In various embodiments, the integrated sensor device 101 of FIG. 1 may be embodied as one or more apparatuses, such as apparatus 200 as shown in FIG. 2. In particular, FIG. 2 illustrates an example circuit diagram of the apparatus 200.

In the embodiment as shown in FIG. 2, the apparatus 200 may include a flow die 202 and a pressure die 204. Similar to the flow sensing element 103 described above in connection with FIG. 1, the flow die 202 may transmit a first signal indicative of an air flow rate and/or a heat transfer rate of the gaseous substance to, for example, the analog-to-digital converter (ADC) 206. Similar to the pressure sensing element 105 described above in connection with FIG. 1, the pressure die 204 may transmit a second signal indicative of a pressure of the gaseous substance to, for example, the analog-to-digital converter (ADC) 206.

In some embodiments, the signals transmitted by the flow die 202 and the pressure die 204 may be analog signals (which may be continuous, fluctuating signals). The ADC 206 may convert analog signals to digital signals (which may have a discrete value at each sample point). In some embodiments, the ADC 206 may further comprise a temperature sensor.

In the embodiment as shown in FIG. 2, the flow die 202 and the pressure die 204 may be powered by a voltage regulator 208, which may be a circuitry or circuitries that provide a constant voltage level.

Further, in the embodiment as shown in FIG. 2, the apparatus 200 may include a microcontroller (μc) 210 that may perform processing functions, such as, for example, the processing functions and/or software instructions described above in connection with the processing circuitry 107 of FIG. 1. The microcontroller 210 may be configured to receive and/or transmit data from and/or to other circuitries and/or apparatuses based on, for example, Serial Peripheral Interface (SPI), Inter-Integrated Circuit ($I^2C$), and/or Joint Test Action Group (JTAG) standard.

Figure 3B:
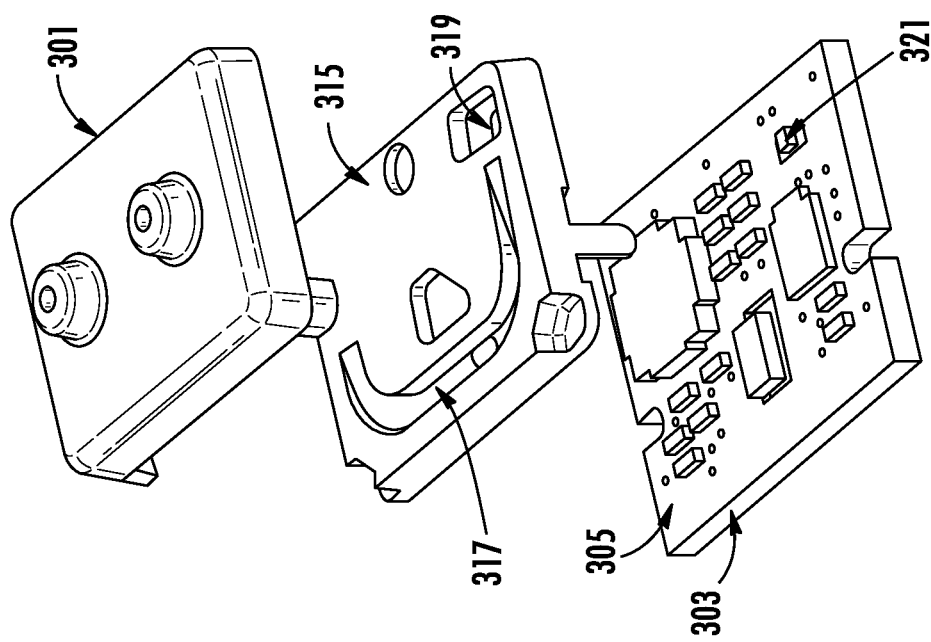
FIG. 3B illustrates an explosive view of an example apparatus in accordance with various embodiments of the present disclosure.
Figure 3A:
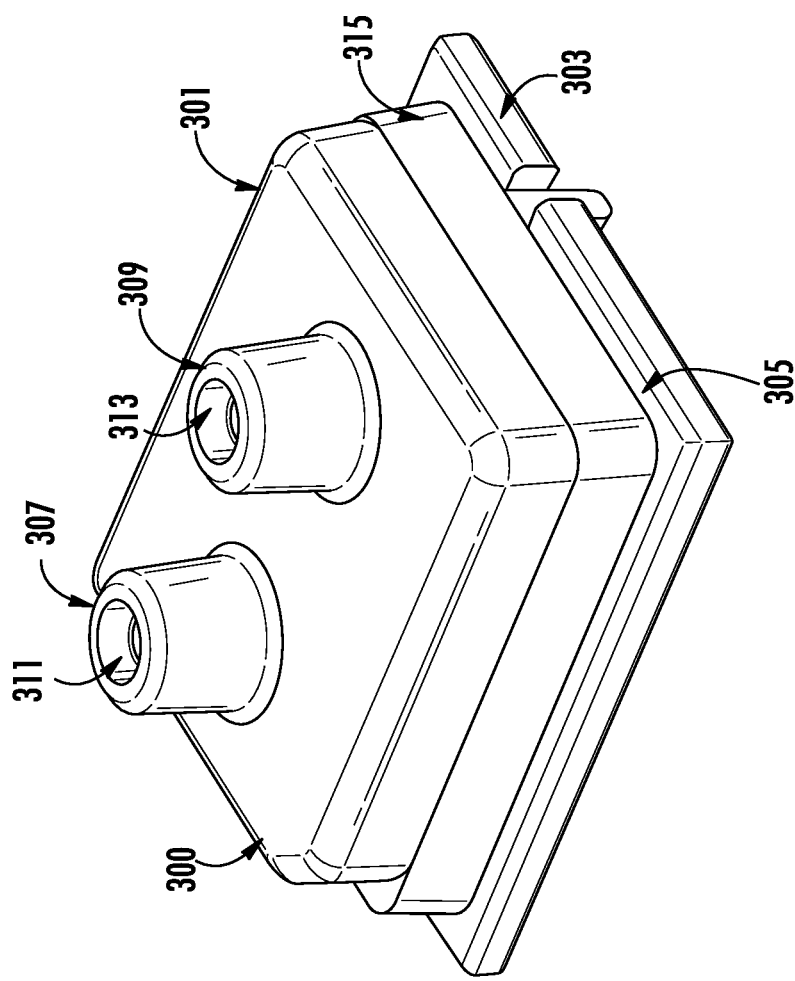
FIG. 3A illustrates a perspective view of an example apparatus in accordance with various embodiments of the present disclosure.

Referring now to FIGS. 3A-3B, example views of an example integrated sensor apparatus 300 are illustrated.

FIG. 3A illustrates an example perspective view of the integrated sensor apparatus 300. As shown in FIG. 3A, the integrated sensor apparatus 300 comprises a cover member 301 and a substrate 303.

The substrate 303 may comprise a first surface 305, and a second surface that is opposite from the first surface 305. In some embodiments, the substrate 303 may include material(s) such as ceramic or fiberglass that provides firm support on elements disposed on the first surface 305 of the substrate 303. In some embodiments, the substrate 303 may include material(s) that have flexible characteristics, such as, for example, rubber or silicon. In some embodiments, the substrate 303 may include other suitable materials or a combination of materials, including, for example, plastic.

The cover member 301 may include material(s) such as, for example, rubber, plastic, ceramic, and/or fiberglass. In some embodiments, the cover member 301 may include other suitable materials or a combination of materials without deviating from the scope of the present disclosure.

In some embodiments, the cover member 301 may be disposed on the first surface 305 of the substrate 303. In some embodiments, one or more intermediate layers may be disposed between the cover member 301 and the first surface 305 of the substrate 303. For example, in the embodiment as shown in FIGS. 3A and 3B, an intermediate layer 315 may be disposed between the cover member 301 and the first surface 305 of the substrate 303. Example details of the intermediate layer 315 is illustrated in FIG. 3B and described in the present disclosure.

Referring back to FIG. 3A, the cover member 301 may include a first port 307 and a second port 309. Each of the first port 307 and the second port 309 may be disposed on and protrude from an outer surface of the cover member 301.

In the embodiment as shown in FIG. 3A, each of the first port 307 and the second port 309 may be in a shape similar to a ring shape. It is contemplated that, in various embodiments, the shapes of the first port 307 and the second port 309 are not limited to the shapes as illustrated in FIG. 3A, and the first port 307 and/or the second port 309 may be in form of other hollow shapes, including, for example, a hollow cuboid shape without deviating from the scope of the present disclosure.

The first port 307 may comprise a first opening 311, and the second port 309 may comprise a second opening 313. In some embodiments, the first opening 311 of the first port 307 and the second opening 313 of the second port 309 may allow gaseous substance (such as air) to enter and/or exit from the integrated sensor apparatus 300. In some embodiments, the first opening 311 and the second opening 313 may be connected inside the integrated sensor apparatus 300 through a flow tunnel. An example flow tunnel 423 for an integrated sensor apparatus 400 is shown in FIG. 4 and described in the present disclosure.

In some embodiments, gaseous substance (such as air) may enter the integrated sensor apparatus 300 via the first opening 311 of the first port 307, and leave the integrated sensor apparatus 300 via the second opening 313 of the second port 309. In some embodiments, the gaseous substance may enter the integrated sensor apparatus 300 via the second opening 313 of the second port 309, and leave the integrated sensor apparatus 300 via the first opening 311 of the first port 307.

Referring now to FIG. 3B, an explosive view of the integrated sensor apparatus 300 is shown. In the embodiment as shown in FIG. 3B, one or more circuitries (such as circuitry 321) may be disposed on the first surface 305 of the substrate 303. In some embodiments, circuitry 321 may be disposed on the first surface 305 of the substrate 303 through, for example, bonding mechanism(s) (such as soldering through a solder) and/or adhesive material(s) (such as epoxy, polyurethane).

Figure 4:
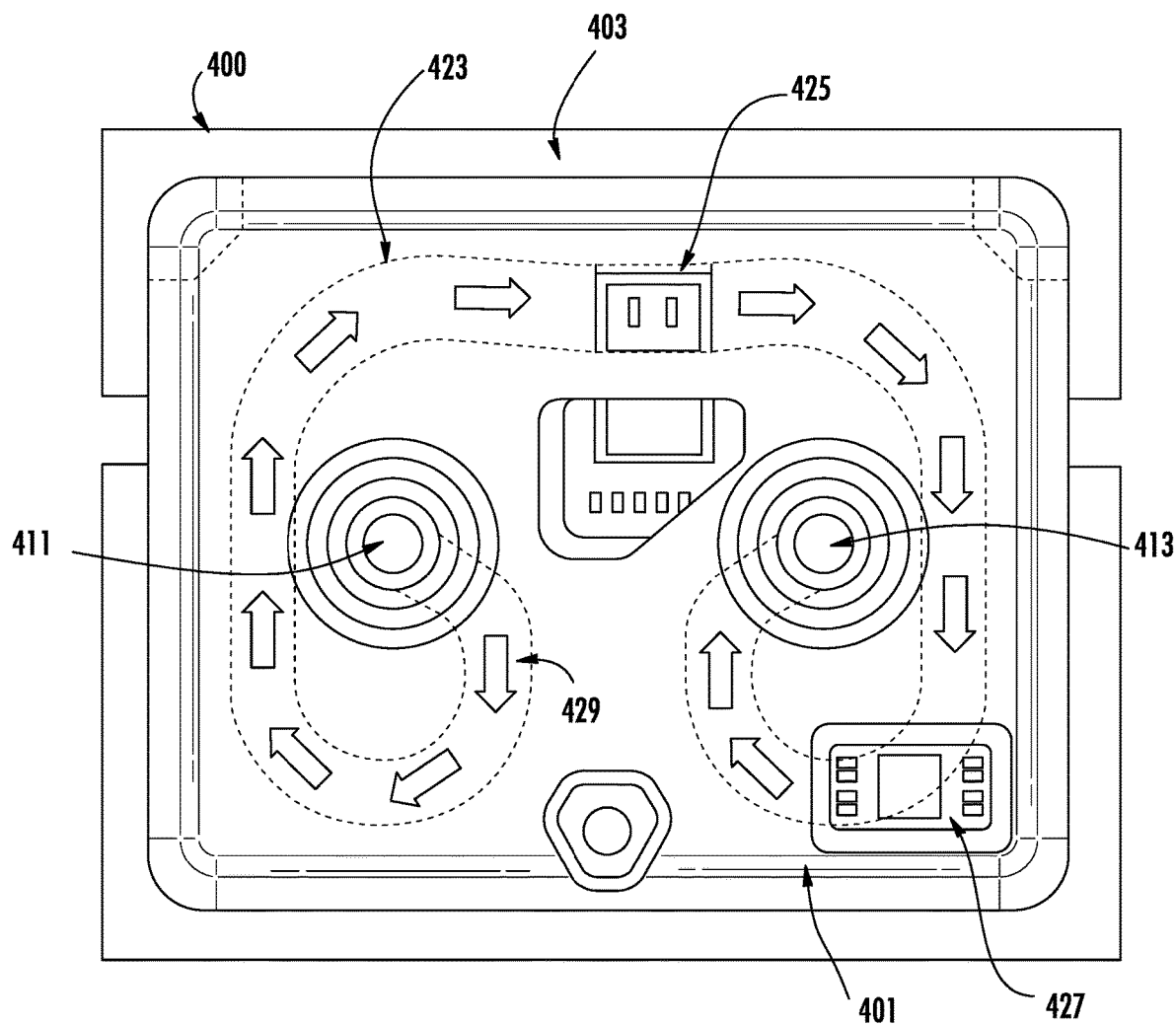
FIG. 4 illustrates a perspective view of an example apparatus in accordance with various embodiments of the present disclosure.

In some embodiments, a flow sensing element and a pressure sensing element may be disposed on the substrate and exposed to the gaseous substance in the flow tunnel, such as the example embodiment as shown in FIG. 4 and described in the present disclosure.

Referring back to FIG. 3B, the integrated sensor apparatus 300 may include an intermediate layer 315. The intermediate layer 315 may be disposed between the substrate 303 and the cover member 301. In some embodiments, the intermediate layer 315 may be disposed on the substrate 303, and secured to the substrate 303 using a locking mechanism, such as a mortise and tenon joint. In some embodiments, the intermediate layer 315 may be secured to the substrate 303 through adhesive material(s), such as, for example, epoxy, polyurethane. In some embodiments, other bonding mechanism(s) may be used to secure the intermediate layer 315 to the substrate 303, without deviating from the scope of the present disclosure. In some non-limiting examples, incorporating the intermediate layer 315 to the integrated sensor apparatus 300 may provide some benefits, including but not limited to, reducing the manufacturing cost associated with the integrated sensor apparatus 300.

Similarly, the cover member 301 may be disposed on the intermediate layer 315 through a locking mechanism and/or adhesive material(s), including the locking mechanism and adhesive materials described above. In some embodiments, other bonding mechanism(s) may be used to secure the cover member 301 to the intermediate layer 315, without deviating from the scope of the present disclosure.

In the embodiment as shown in FIG. 3B, the intermediate layer 315 may include a tunnel cavity 317. As described above, the first opening 311 and the second opening 313 may provide openings for a flow tunnel. The tunnel cavity 317 may provide part of an inner wall for the flow tunnel, which may guide the gaseous substance through a flow path. In some embodiments, the cover member 301 may also include one or more cavities that provide part(s) of the inner wall for the flow tunnel. An example flow tunnel 423 for an integrated sensor apparatus 400 is illustrated in connection with FIG. 4 and described in the present disclosure.

In some embodiments, the intermediate layer 315 may include one or more additional cavities, such as the circuitry cavity 319. The circuitry cavity 319 may be positioned corresponding to the position(s) of one or more circuitries (such as circuitry 321) disposed on the first surface 305 of the substrate 303, such that the one or more circuitries may pass through the intermediate layer 315 and exposed to the gaseous substance in the flow tunnel.

As described above, example circuitries that are exposed to the gaseous substance in the flow tunnel may include a flow sensing element and a pressure sensing element, such as, for example, as illustrated in FIG. 4 and described in the present disclosure.

Referring now to FIG. 4, an example perspective top view of an integrated sensor apparatus 400 is provided.

Similar to the integrated sensor apparatus 300 described above in connection with FIGS. 3A-3B, the integrated sensor apparatus 400 comprises a cover member 401 and a substrate 403.

In some embodiments, the substrate 403 may include material(s) such as ceramic or fiberglass that provides firm support on elements disposed on the substrate 403. In some embodiments, the substrate 403 may include material(s) that have flexible characteristics, such as, for example, rubber or silicon. In some embodiments, the substrate 403 may include other suitable materials or a combination of materials, including, for example, plastic.

In some embodiments, the cover member 401 may include material(s) such as, for example, rubber, plastic, ceramic, and/or fiberglass. In some embodiments, the cover member 401 may include other suitable materials or a combination of materials without deviating from the scope of the present disclosure.

In addition, similar to the cover member 301 described above in connection with FIGS. 3A-3B, the cover member 401 may comprise a first opening 411 and a second opening 413. In some embodiments, the first opening 411 may be part of a first port that is disposed on and protrudes from the surface of the cover member 401, and/or the second opening 413 may be part of a second port that is disposed on and protrudes from the surface of the cover member 401. In some embodiments, the first opening 411 and/or the second opening 413 is/are on the surface of the cover member 401 without any protrusion.

Further, the integrated sensor apparatus 400 may comprise a flow tunnel 423 that connects the first opening 411 and the second opening 413, and provides a flow path 429 for gaseous substance (such as air) to pass through the integrated sensor apparatus 400.

In some embodiments, the flow tunnel 423 may be defined by one or more cavities within the cover member 401. For example, the integrated sensor apparatus 400 may comprise one or more layers with one or more cavities (for example, a tunnel cavity 317 described above in connection with FIG. 3B), and these cavities may be connected such that they together form a tunnel that connects the first opening 411 and the second opening 413. In some embodiments, the flow tunnel 423 may be a tubing that connects the first opening 411 and the second opening 413. In some embodiments, the flow tunnel 423 may be in any other suitable form that enables a gaseous substance to flow through.

FIG. 4 also illustrates the flow path 429 (as a series of arrows indicating the direction that the gaseous substance may travel in the flow tunnel 423). In the embodiment as shown in FIG. 4, the gaseous substance may enter the integrated sensor apparatus 400 through the first opening 411, pass through the flow tunnel 423, and exit the integrated sensor apparatus 400 through the second opening 413. In some embodiments, the gaseous substance may enter the integrated sensor apparatus 400 through the second opening 413, pass through the flow tunnel 423, and exit the integrated sensor apparatus 400 through the first opening 411.

Further, as shown in FIG. 4, one or more circuitries (such as a flow sensing element 425 and a pressure sensing element 427) may be disposed on the substrate 403, and may be exposed to the gaseous substance that passes through the flow tunnel 423. In other words, the flow sensing element 425 and the pressure sensing element 427 are disposed on the flow path 429 of the integrated sensor apparatus 400.

Similar to the flow sensing element 103 described above in connection with FIG. 1, the flow sensing element 425 may comprise a heater resistor and two temperature-sensing resistors. The flow sensing element 425 may generate a signal indicative of the air flow rate and/or the heat transfer rate detected from the gaseous substance passing through the flow tunnel 423, and may transmit the signal to a processing circuitry within the integrated sensor apparatus 400 and/or outside the integrated sensor apparatus 400.

Similar to the pressure sensing element 105 described above in connection with FIG. 1, the pressure sensing element 427 may generate a signal indicative of the pressure detected from the gaseous substance passing through the flow tunnel 423, and may transmit the signal to a processing circuitry within the integrated sensor apparatus 400 and/or outside the integrated sensor apparatus 400.

As descried above, in various embodiments, the flow sensing element 425 and the pressure sensing element 427 are disposed on the flow path 429 of the integrated sensor apparatus 400. In some embodiments, the flow sensing element 425 may be positioned prior to the pressure sensing element 427 along the flow path 429. For example, in the embodiment as shown in FIG. 4, the gaseous substance may pass the flow sensing element 425 before passing the pressure sensing element 427. In some embodiments, a pressure sensing element may be positioned prior to a flow sensing element along a flow path. In some embodiments, a flow sensing element may be at the same point in a flow path as a pressure sensing element.

In the embodiment as shown in FIG. 4, the flow tunnel 423 may include one or more turns along the flow path 429. In some non-limiting examples, these turns may allow the flow tunnel 423 to provide a relatively long flow path 429, which may, for example, improve the accuracy of measurements from the flow sensing element 425 and/or the pressure sensing element 427. In some embodiments, the flow tunnel 423 may have a length to diameter (i.e. the diameter of the flow tunnel 423 in a cross-section view) ratio for 10 to 1. In some embodiment, other ratios may be used.

Further, while the embodiment as shown in FIG. 4 illustrates that both the flow sensing element 425 and the pressure sensing element 427 are disposed along the same flow path 429, in some embodiments, they may be disposed along different flow paths of an integrated sensor apparatus. In some embodiments, an example integrated sensor apparatus may comprise two or more flow paths for gaseous substance(s), and a flow sensing element may be disposed on a flow path that is different from the flow path that a pressure sensing element may be disposed on.

In some embodiments, an example integrated sensor apparatus may comprise two or more flow sensing element(s) and/or two or more pressure sensing element(s).

As will be appreciated from the description above, the integrated sensor apparatuses 300 and 400 may, for example, enable the measurement of flow rate and pressure from a gaseous substance. In some examples, the measured flow rate and pressure may be used to determine thermal conductivity, thereby may, for example, enabling the detection and calculation of thermal conductivity using a single integrated sensor apparatus.

Figure 5:
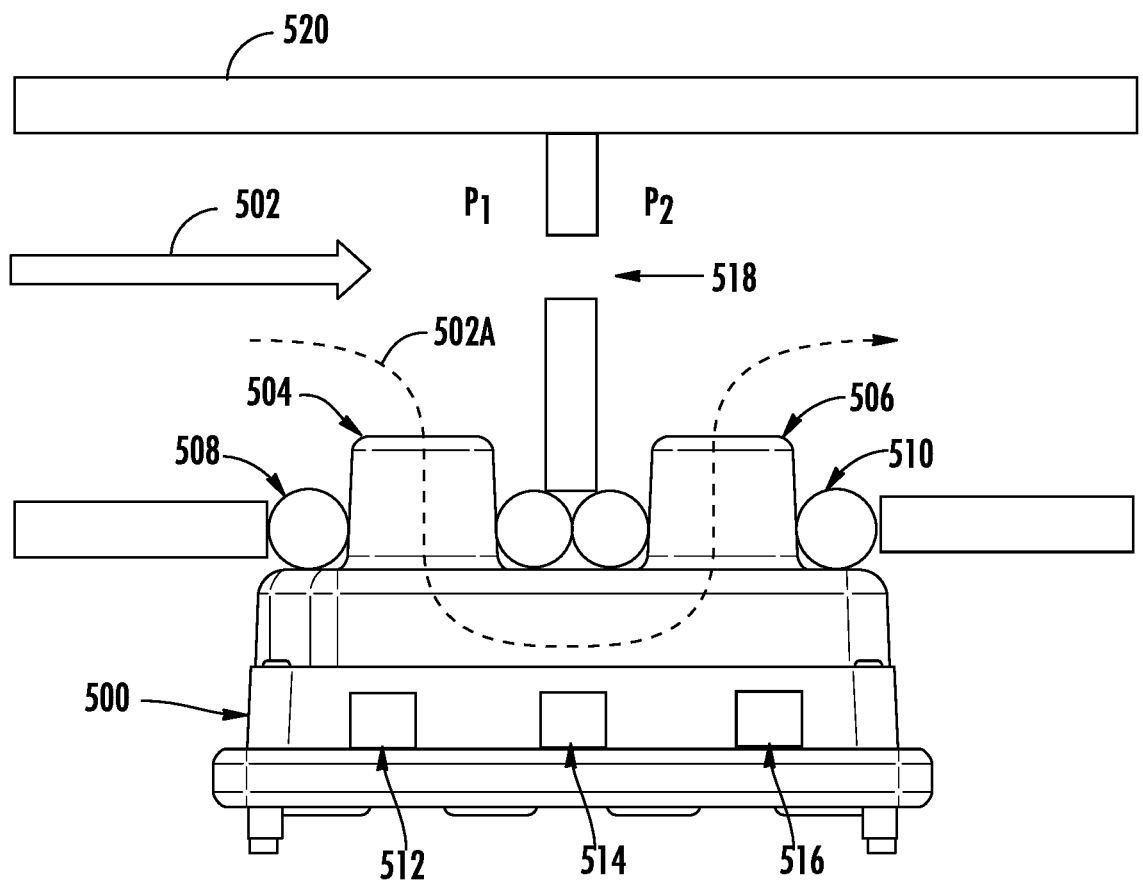
FIG. 5 illustrates an interface diagram of an example apparatus in accordance with various embodiments of the present disclosure.

Referring now to FIG. 5, an example mechanical interface diagram is shown. In particular, the example mechanical interface diagram illustrates an integrated sensor apparatus 500 (similar to the integrated sensor apparatus 300 described above in connection with FIG. 3).

In FIG. 5, an example gaseous substance (such as air) may travel through a tube structure 520 in the direction as shown by the arrow 502. The tube structure 520 may include an orifice 518. When the gaseous substance passes through the orifice 518, pressure may build up upstream of the orifice 518 as compared to the downstream of the orifice 518. For example, as shown in FIG. 5, if $P_1$ indicates the upstream pressure, and $P_2$ is the downstream pressure, then:

$$P_1 > P_2, \text{ where } \Delta P = P_1 - P_2$$

In some examples, at least partially due to the pressure difference $\Delta P$, a portion of the gaseous substance may travel through the integrated sensor apparatus 500, as shown by the arrow 502A. In particular, the gaseous substance may enter the integrated sensor apparatus 500 through a first opening 504, and exit the integrated sensor apparatus 500 through a second opening 506. The first opening 504 and the second opening 506 may be similar to the first opening 311 and the second opening 313, respectively, described above in connection with FIGS. 3A-3B.

In the embodiment as shown in FIG. 5, the gaseous substance may be in contact with sensing elements as it travels inside the integrated sensor apparatus 500, and these sensing elements are disposed along the flow path. For example, a flow sensing element 514 and a pressure sensing element 516 may be exposed to the gaseous substance.

Similar to the flow sensing element 103 described above in connection with FIG. 1, the flow sensing element 514 may comprise a heater resistor and two temperature-sensing resistors. The flow sensing element 514 may generate a signal indicative of the air flow rate and/or the heat transfer rate as the gaseous substance passing through the integrated sensor apparatus 500, and may transmit the signal to a processing circuitry within the integrated sensor apparatus 500 and/or outside the integrated sensor apparatus 500.

Similar to the pressure sensing element 105 described above in connection with FIG. 1, the pressure sensing element 516 may generate a signal indicative of the pressure as the gaseous substance passing through the integrated sensor apparatus 500, and may transmit the signal to a processing circuitry within the integrated sensor apparatus 500 and/or outside the integrated sensor apparatus 500.

In some embodiments, the integrated sensor apparatus 500 may also include a temperature sensing element 512 exposed to the gaseous substance along the flow path. The temperature sensing element 512 may generate a signal based on the temperature detected from the gaseous substance, and may transmit the signal to a processing circuitry within the integrated sensor apparatus 500 and/or outside the integrated sensor apparatus 500.

In some embodiments, the integrated sensor apparatus 500 may be secured to the tube structure 520 through, for example, sealing components such as a sealing ring 508 and a sealing ring 510. The sealing ring 508 and the sealing ring 510 may include flexible material, such as, for example, rubber, silicone, and/or other suitable material(s), and may be secured to the openings of the tube structure 520 to prevent gaseous substance from escaping the tube structure 520.

In some embodiments, the integrated sensor apparatus 500 may be disposed and secured on a surface, such as a surface of a printed circuit board (PCB).

Many embodiments of the present disclosure may provide technical advantages and benefits. As a non-limiting example, by integrating a pressure sensing element with the flow sensing element, the present disclosure may provide a simple solution for calculating both the air flow rate and the thermal conductivity in a single, miniaturized device. Such device can be applied in many products or systems, including, but not limited to, an oxygen concentrator for purposes such as determining gas composition based on thermal conductivity.

Figure 6:
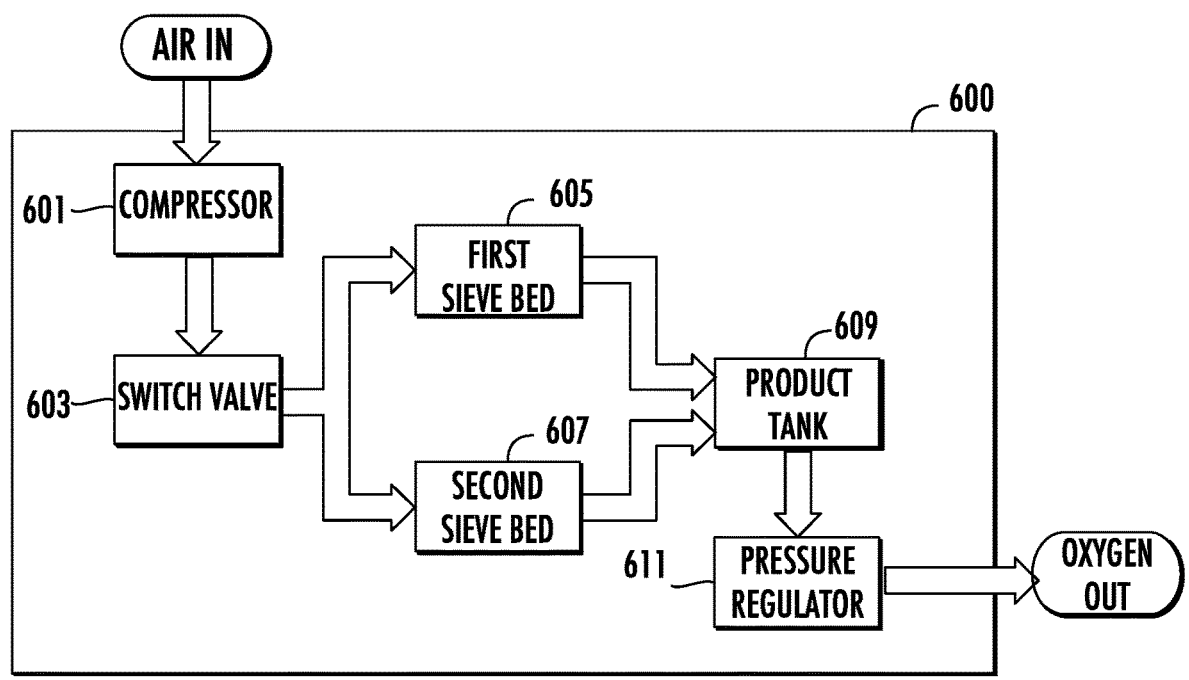
FIG. 6 illustrates a block diagram of an example oxygen concentrator apparatus in accordance with various embodiments of the present disclosure.

An oxygen concentrator is a device that may provide oxygen at a high level of concentration by concentrating oxygen from a gas supply (such as ambient air). Referring now to FIG. 6, an example block diagram showing various components of an oxygen concentrator apparatus 600 is illustrated.

In the embodiment as illustrated in FIG. 6, the compressor 601 may be configured to compress and push ambient air into the oxygen concentrator apparatus 600. In some embodiments, the compressor 601 may be powered by a motor.

The oxygen concentrator apparatus 600 may include a switch valve 603, which may pass the ambient air from the compressor 601 into one of two sieve beds, that is, a first sieve bed 605 and a second sieve bed 607. A sieve bed is a filtering device made of a material having holes with diameters similar to the size of small molecules. For example, in the oxygen concentrator apparatus 600, the first sieve bed 605 and a second sieve bed 607 may be configured to filter and remove nitrogen molecules from ambient air, resulting in a high-level concentration of oxygen. TABLE 1 below illustrates example composition percentages by volume before entering the first sieve bed 605 (or the second sieve bed 607), and after passing through the first sieve bed 605 (or the second sieve bed 607):

TABLE 1

Example Composition Percentages

| Composition | Before Sieve Bed | After Sieve Bed |
|---|---|---|
| $N_2$ | 78.08% | 0% |
| $O_2$ | 20.95% | 95.57% |
| Ar | 0.93% | 4.42% |
| $CO_2$ | 0.04% | 0.18% |

As shown in TABLE 1, the first sieve bed 605 (or the second sieve bed 607) may remove 100% of nitrogen from ambient air. As a result, the percentage of oxygen rise from 20.95% to 95.75% (and the percentage of argon rising from 0.93% to 4.42%).

The oxygen concentrator apparatus 600 may include a product tank 609, which may be configured as a reservoir for the concentrated oxygen. The oxygen concentrator apparatus 600 may also include a pressure regulator 611, which may be a control valve that reduces the pressure of concentrated oxygen to a desired level.

In some embodiments, fewer or more components may be included in the oxygen concentrator apparatus 600. For example, the oxygen concentrator apparatus 600 may include a surge tank that is connected to the compressor 601 and the switch valve 603. The surge tank may be configured to temporarily store the ambient air from the compressor 601, and may provide pressure control. As another example, one or more filters may be disposed before and/or after the compressor 601, which may filter particles such as dust.

While TABLE 1 illustrates a high-level concentration of oxygen, in some examples, a faulty oxygen concentrator may fail to work properly, resulting in a less than desired concentration level of oxygen. For example, TABLE 2 below illustrates example composition percentages by volume before entering a faulty oxygen concentrator and after exiting the faulty oxygen concentrator:

TABLE 2

Example Composition Percentages

| Composition | Before Faulty Oxygen Concentrator | After Faulty Oxygen Concentrator |
|---|---|---|
| $N_2$ | 78.08% | 10.00% |
| $O_2$ | 20.95% | 86.02% |
| Ar | 0.93% | 3.82% |
| $CO_2$ | 0.04% | 0.16% |

As shown in TABLE 2, the oxygen percentage after the faulty oxygen concentrator is less than 90% (at 86.02%). This may be caused by a variety of factors, including, for example, a faulty sieve bed and/or leakage of the faulty oxygen concentrator.

In the present disclosure, an integrated sensor apparatus in accordance with various embodiments may be implemented in an oxygen concentrator apparatus to determine the output composition from the oxygen concentrator. As described above, the integrated sensor apparatus of the present disclosure may include a flow sensing element and a pressure sensing element disposed on the flow path, and may generate signals that can be used to calculate the thermal conductivity. Because different compositions of air may have different thermal conductivities (for example, argon may have a thermal conductivity of 17.72 mW/(m*k), while oxygen may have a thermal conductivity of 26.58 mW/(m*k)), the composition may be determined based on the thermal conductivity.

For example, referring back to FIG. 6, an integrated sensor apparatus in accordance with various embodiments of the present disclosure may be disposed within the product tank 609 of the oxygen concentrator apparatus 600, and may determine whether the oxygen composition is at or above a desired level based on the thermal conductivity. In some other examples, an integrated sensor apparatus may be connected to the pressure regulator 611 of the oxygen concentrator apparatus 600, and may determine the flow rate as well as the thermal conductivity of the gaseous substance exiting from the oxygen concentrator apparatus 600.

It is to be understood that the disclosure is not to be limited to the specific embodiments disclosed, and that modifications and other embodiments are intended to be included within the scope of the appended claims. Although specific terms are employed herein, they are used in a generic and descriptive sense only and not for purposes of limitation, unless described otherwise.

The invention claimed is:

1. An apparatus, comprising:
a substrate;
a cover member comprising a flow tunnel, wherein the cover member is disposed on the substrate and configured to enable a gaseous substance to flow through the flow tunnel;
a flow sensing element disposed on the substrate, wherein the flow sensing element is exposed to the gaseous substance in the flow tunnel and configured for sensing a flow rate of the gaseous substance through the flow tunnel;
a pressure sensing element disposed on the substrate, wherein the pressure sensing element is exposed to the gaseous substance in the flow tunnel and configured for sensing a pressure of the gaseous substance in the flow tunnel; and
a processing circuitry configured to calculate a thermal conductivity of the gaseous substance based on the flow rate and the pressure sensed by the flow sensing element and the pressure sensing element respectively.

2. The apparatus of claim 1, wherein the cover member comprises a first port having a first opening and a second port having a second opening, wherein the first opening and the second opening are connected to one another by the flow tunnel.

3. The apparatus of claim 1, further comprising an intermediate layer disposed between the substrate and the cover member, wherein the intermediate layer comprises a tunnel cavity.

4. The apparatus of claim 1, wherein the flow sensing element comprises a heater resistor, a first temperature-sensing resistor and a second temperature-sensing resistor, wherein the heater resistor, the first temperature-sensing resistor and the second temperature-sensing resistor are disposed on the substrate.

5. The apparatus of claim 4, wherein the heater resistor is disposed between the first temperature-sensing resistor and the second temperature-sensing resistor on the substrate.

6. The apparatus of claim 1, wherein the flow sensing element is a micro-electromechanical system (MEMS) flow sensing die.

7. The apparatus of claim 1, wherein the pressure sensing element is a micro-electromechanical system (MEMS) pressure sensing die.

8. The apparatus of claim 1, further comprising the processing circuitry disposed on the substrate, wherein the processing circuitry is electronically coupled to the flow sensing element and the pressure sensing element.

9. The apparatus of claim 8, wherein the flow sensing element is configured to transmit a first signal indicative of a heat transfer rate of the gaseous substance to the processing circuitry, wherein the pressure sensing element is configured to transmit a second signal indicative of a pressure of the gaseous substance to the processing circuitry.

10. A system for calculating a thermal conductivity of a gaseous substance, the system comprising:
a cover member comprising a flow tunnel, wherein the cover member is configured to enable the gaseous substance to flow through the flow tunnel
a flow sensing element disposed on a substrate, wherein the flow sensing element is exposed to the gaseous substance in the flow tunnel;
a pressure sensing element disposed on the substrate, wherein the pressure sensing element is exposed to the gaseous substance in the flow tunnel; and
a processing circuitry disposed on the substrate, wherein the processing circuitry is electronically coupled to the flow sensing element and the pressure sensing element and configured to calculate the thermal conductivity of the gaseous substance based on a flow rate and a pressure sensed by the flow sensing element and the pressure sensing element respectively.

11. The system of claim 10, wherein the flow sensing element is configured to transmit a first signal indicative of a heat transfer rate of the gaseous substance to the processing circuitry, wherein the pressure sensing element is configured to transmit a second signal indicative of a pressure of the gaseous substance to the processing circuitry.

12. The system of claim 10, wherein the flow sensing element further comprises a heater resistor, a first temperature-sensing resistor and a second temperature-sensing resistor, wherein the heater resistor, the first temperature-sensing resistor and the second temperature-sensing resistor are disposed on the substrate.

13. The system of claim 12, wherein the heater resistor is disposed between the first temperature-sensing resistor and the second temperature-sensing resistor on the substrate.

14. The system of claim 10, wherein the flow sensing element is a micro-electromechanical system (MEMS) flow sensing die.

15. The system of claim 10, wherein the pressure sensing element is a micro-electromechanical system (MEMS) pressure sensing die.

16. The system of claim 10, wherein the cover member is disposed on the substrate.

17. The system of claim 16, wherein the cover member comprises a first port having a first opening and a second port having a second opening, wherein the first opening and the second opening are connected through the flow tunnel.

18. The system of claim 17, wherein the flow sensing element and the pressure sensing element are exposed to the gaseous substance in the flow tunnel.

* * * * *